(12) United States Patent
Marsili

(10) Patent No.: US 7,164,327 B2
(45) Date of Patent: Jan. 16, 2007

(54) COMPENSATION OF THE IQ PHASE ASYMMETRY IN QUADRATURE MODULATION AND DEMODULATION METHODS

(75) Inventor: Stefano Marsili, Fürnitz (AT)

(73) Assignee: Infineon Technologies AG, Munich (DE)

(*) Notice: Subject to any disclaimer, the term of this patent is extended or adjusted under 35 U.S.C. 154(b) by 75 days.

(21) Appl. No.: 10/893,623

(22) Filed: Jul. 16, 2004

(65) Prior Publication Data

US 2005/0013388 A1 Jan. 20, 2005

(30) Foreign Application Priority Data

Jul. 17, 2003 (DE) .................. 103 32 584

(51) Int. Cl.
*H03C 3/00* (2006.01)

(52) U.S. Cl. .............. 332/103; 375/261; 375/324; 329/306

(58) Field of Classification Search ............... 332/103; 375/261, 324; 329/306, 261
See application file for complete search history.

(56) References Cited

U.S. PATENT DOCUMENTS

| 5,705,949 | A | 1/1998 | Alelyunas et al. | 329/304 |
|---|---|---|---|---|
| 6,330,290 | B1 * | 12/2001 | Glas | 375/324 |
| 6,895,045 | B1 * | 5/2005 | Ozluturk et al. | 375/235 |

FOREIGN PATENT DOCUMENTS

EP 1 120 944 A2 1/2001

* cited by examiner

*Primary Examiner*—Arnold Kinkead
(74) *Attorney, Agent, or Firm*—Baker Botts L.L.P.

(57) ABSTRACT

A simplified compensation matrix is set up for the compensation of phase errors between the I and the Q component in data transmission systems with quadrature modulation or demodulation. This simplified compensation matrix permits a previously determined phase error $\Delta\phi$ to be used as the basis for replacing two of the multipliers required in the conventional circuit configurations by relatively simple shift registers (4, 5) for a multiplication by 1 or by a constant.

20 Claims, 2 Drawing Sheets

COMPENSATION OF THE IQ PHASE ASYMMETRY IN QUADRATURE MODULATION AND DEMODULATION METHODS

PRIORITY

This application claims priority to German application no. 103 32 584.0 filed Jul. 17, 2003.

TECHNICAL FIELD OF THE INVENTION

The present invention generally relates to a method for the compensation of the phase asymmetry between the inphase and the quadrature component in radio signal transmitters or receivers in which quadrature modulation or quadrature demodulation methods are used.

DESCRIPTION OF RELATED ART AND BACKGROUND OF THE INVENTION

The reception and the demodulation of radio signals can be performed by means of conventional reception concepts, which are based on the principle of heterodyne reception with subsequent digital quadrature mixing. However, more advanced reception concepts, in which directly mixing methods are used, are becoming increasingly preferred for reasons relating to lower power consumption and the avoidance of chip-external filters for mirror-image frequency suppression. In the case of directly mixing receiver concepts, the radio signal, which is received via an antenna and is amplified, is split into an inphase (I) and a quadrature (Q) path and is mixed in both paths using the output frequency from a local oscillator, the oscillator frequencies which are supplied to the mixers being mutually shifted through 90° by means of a phase shifter. Consequently, with this reception concept, the quadrature demodulation is executed to recover the information-carrying baseband signals in analogue circuit engineering.

It is possible to make use in radio transmitters of, for example, quadrature modulation in the form of quadrature amplitude modulation (QAM) or of quadrature phase modulation (QPSK, Quadrature Phase Shift Keying), a carrier oscillation always being split into mutually orthogonal I and Q components, and both components being modulated by independent data sequences, and the modulated signals being combined to form an output signal to be transmitted.

So-called IQ asymmetries or IQ distortions, that is to say asymmetries in amplitude and phase, occur between the quadrature components as a result of technically induced inaccuracies in the production process and of the non-ideal natures of the analogue mixers and oscillators, as well as of deviations between the filters in the I and Q paths. Real and imaginary parts of the complex baseband signal are not mutually phase-shifted by exactly 90° and, moreover, deviations in amplitude occur between the I and Q paths. These IQ asymmetries have a negative influence on the reception quality of a radio signal receiver with an analogue quadrature stage (also denoted as a complex radio signal receiver). For example, in the case of OFDM-based transmission systems, for example, the IQ asymmetries lead in the frequency domain, that is to say after the so-called FFT transformation (fast Fourier transform) in the receiver, to mutual interference between in each case two data symbols on the subcarriers whose frequencies are arranged symmetrically relative to the centre frequency of the OFDM frequency spectrum. Owing to the IQ asymmetry added in the time domain, each data symbol transmitted on a subcarrier n generates a signal contribution on a subcarrier with the index −n (mirror-image frequency). The superimposition therefore leads to distortions in the useful signals at the positions n and −n. In the dissertation entitled "Verfahren der digitalen Kompensation von Unsymmetrien der analogen Quadraturmischung in OFDM-Empfängern" [Method for the digital compensation of asymmetries in analogue quadrature mixing in OFDM receivers"] by Andreas Schuchert, accepted by the Department of Electrical Engineering and Information Technology of Wuppertal Mining University) Chapter 4 gives a mathematical description of the IQ asymmetries, and supplies a quantitative estimate of the interference contribution occurring at the mirror-image frequency of a desired signal.

The said IQ asymmetries also have a negative effect in just such a way on the quality of the radio transmitters operating with the quadrature modulation method.

U.S. Pat. No. 5,705,949 describes a compensation method of IQ asymmetries in a complex radio signal receiver by means of which the asymmetries between the I path and the Q path are compensated with regard to the offset, the signal level and the phase in a digital signal processor (DSP). With regard to the phase compensation, the phase error between the components is firstly determined, and subsequently a compensation matrix is calculated in the DSP and multiplied by the vector of the I and Q components in order to obtain the compensated I and Q components. The phase compensator has the task of reversing the IQ distortion caused by the phase error $\Delta\phi$ in accordance with the following equation.

$$\begin{bmatrix} S_I \\ S_Q \end{bmatrix} = \begin{bmatrix} \cos\left(\frac{\Delta\varphi}{2}\right) & \sin\left(\frac{\Delta\varphi}{2}\right) \\ \sin\left(\frac{\Delta\varphi}{2}\right) & \cos\left(\frac{\Delta\varphi}{2}\right) \end{bmatrix} \cdot \begin{bmatrix} S'_I \\ S'_Q \end{bmatrix} \quad (1)$$

Here, the primed variables are the undistorted IQ components while the unprimed variables represent the IQ components distorted by the phase error.

To reverse the phase distortion, the compensation matrix which is inverse to the distortion matrix of the equation (1) and appears as follows except for a constant factor:

$$\begin{bmatrix} \cos\left(\frac{\Delta\varphi}{2}\right) & -\sin\left(\frac{\Delta\varphi}{2}\right) \\ -\sin\left(\frac{\Delta\varphi}{2}\right) & \cos\left(\frac{\Delta\varphi}{2}\right) \end{bmatrix} \quad (2)$$

can be multiplied by both sides of the equation.

Consequently, the conversion of this compensation matrix into a phase compensation circuit requires four multipliers and two adders using digital circuit engineering, as represented in the phase compensation part of the digital signal processor shown in the sole figure of the drawing in U.S. Pat. No. 5,705,949.

A comparable compensation scheme for a QPSK modulation method (quadrature phase shift keying) is used in EP 1 120 944 A2. The modulation scheme of FIG. 1 in that document includes for the compensation of the IQ phase errors an IQ phase rotator which is illustrated in FIG. 7 of that document. In this case, as well, four digital multipliers and two digital adders are used to carry out the multiplication by the compensation matrix in accordance with the above compensation matrix (2).

There is a relatively high outlay on the implementation of the phase compensation scheme of the two said documents, since, firstly, four digital multipliers have to be used, and two different correction signals must be fed to these multipliers, specifically the sine and the cosine of half the phase error. The two correction signals of sine and cosine must therefore be quantized, and the values must be stored in a table or must be calculated with the aid of a non-linear function of the uniform control signal $\Delta\phi$. In order, furthermore, to be able to represent the cosine with sufficient resolution, a relatively large word length is required, in particular, for small values of $\Delta\phi$, for which the cosine is close to 1, and the two multipliers which are fed the cosine therefore have to be of relatively large design.

SUMMARY OF THE INVENTION

Consequently, it is an object of the present invention to specify a method for the compensation of the phase asymmetry between I and Q components in the case of quadrature modulation and demodulation methods, which method can be implemented more easily and with a lower outlay.

This object can be achieved by a method for the compensation of the phase asymmetry between the inphase (I) and the quadrature (Q) components in the case of quadrature modulation or demodulation, comprising the steps of:

determining the phase error $\Delta\phi$ between the uncompensated I and Q components, obtaining a compensated I component by subtracting from the I component, which is uncompensated, unaltered or multiplied by a constant, the product of the Q component and an error term dependent on the phase error $\Delta\phi$, and obtaining a compensated Q component by subtracting from the Q component, which is uncompensated, unaltered or multiplied by a constant, the product of the I component and the error term.

The error term can be proportional to $\tan(\Delta\phi/2)$. The error term can also be equal to $\tan(\Delta\phi/2)\times2^N$, wherein N being a natural number, and the uncompensated I component is multiplied by $2^N$ when calculating the compensated I component, and the uncompensated Q component is multiplied by $2^N$ when calculating the compensated Q component. To calculate a vector of the compensated components, a vector of the uncompensated components can be multiplied by the compensation matrix $$\begin{bmatrix} 1 & -\tan\left(\frac{\Delta\varphi}{2}\right) \\ -\tan\left(\frac{\Delta\varphi}{2}\right) & 1 \end{bmatrix}.$$

A plurality of iterations of the method can be passed through, the number of the iterations being prescribed, or iterations are passed through until the phase error undershoots a prescribed limit. The method can be used in a radio signal receiver with an analogue quadrature stage, in particular a directly mixing radio signal receiver. The method can also be used in a radio signal receiver in which a quadrature modulation method is employed.

The object can furthermore be achieved by a device for carrying out the method according to claim 1, comprising two inputs for the uncompensated I and Q components and two outputs for the compensated I and Q components, a calculation unit for calculating the phase error $\Delta\phi$ from the compensated or the uncompensated I and Q components and outputting the error term, a first multiplier, connected to the calculation unit, for the multiplication of the uncompensated Q component by the error term, a second multiplier, connected to the calculation unit, for the multiplication of the uncompensated I component by the error term, a first adder, which can be fed the uncompensated I component, which is unaltered or multiplied by a constant, and which adder is connected to the first multiplier, and a second adder, which can be fed the uncompensated Q component, which is unaltered or multiplied by a constant, and which adder is connected to the second multiplier.

The object can also be achieved by a device for the compensation of the phase asymmetry between the inphase (I) and the quadrature (Q) components in the case of quadrature modulation or demodulation, comprising two inputs for uncompensated I and Q components and two outputs for compensated I and Q components, a calculation unit for calculating an phase error $\Delta\phi$ from the compensated or the uncompensated I and Q components and outputting an error term, a first multiplier, connected to the calculation unit, for the multiplication of the uncompensated Q component by the error term, generating a first multiplication value, a second multiplier, connected to the calculation unit, for the multiplication of the uncompensated I component by the error term, generating a second multiplication value, a first adder, which can be fed the uncompensated I component, which is unaltered or multiplied by a constant, and which adder is fed with the first multiplication value, and a second adder, which can be fed the uncompensated Q component, which is unaltered or multiplied by a constant, and which adder is fed with the second multiplication value.

The error term can be equal to $\tan(\Delta\phi/2)\times2^N$, and the device may further comprise a third multiplier for a multiplication of the I component by the factor $2^N$ before feeding to the first adder, and a fourth multiplier for a multiplication of the Q component by the factor $2^N$ before feeding to the second adder. The third and/or the fourth multiplier can be formed by shift registers which are driven in such a way that bit words fed are shifted by N bit positions in the direction of the most significant bit position. The device may further comprise a third adder following the first adder for adding a constant and a first divider following the third adder for dividing an output of the third adder by a factor $2^N$, and a fourth adder following the second adder for adding a constant and a second divider following the fourth adder for dividing an output of the fourth adder by a factor $2^N$. The first and/or the second divider can be formed by shift registers which are driven in such a way that bit words fed are shifted by N bit positions in the direction of the least significant bit position.

The invention proceeds from the consideration that the above equation (1) can also be expressed as follows.

$$\begin{bmatrix} S_I \\ S_Q \end{bmatrix} = \cos\left(\frac{\Delta\varphi}{2}\right) \cdot \begin{bmatrix} 1 & \tan\left(\frac{\Delta\varphi}{2}\right) \\ \tan\left(\frac{\Delta\varphi}{2}\right) & 1 \end{bmatrix} \cdot \begin{bmatrix} S'_I \\ S'_Q \end{bmatrix} \quad (3)$$

Instead of using the matrix inverse to the distortion matrix of equation (3) for the purpose of phase compensation, it is also possible to use the following compensation matrix:

$$\begin{bmatrix} 1 & -\tan\left(\frac{\Delta\varphi}{2}\right) \\ -\tan\left(\frac{\Delta\varphi}{2}\right) & 1 \end{bmatrix} \quad (4)$$

Multiplying the compensation matrix (4) by both sides of equation (3) admittedly does not provide the unit matrix on the right-hand side, but the following diagonal matrix:

$$\cos\left(\frac{\Delta\varphi}{2}\right) \cdot \begin{bmatrix} 1 - \tan\left(\frac{\Delta\varphi}{2}\right)^2 & 0 \\ 0 & 1 - \tan\left(\frac{\Delta\varphi}{2}\right)^2 \end{bmatrix} \quad (5)$$

This means that the compensation is complete because of the diagonality of the matrix, and only the output power becomes slightly greater (of the order of magnitude of at most 0.07 dB for ordinary phase errors up to 5°).

However, when use is made of the compensation matrix (4) the outlay on implementing the phase compensation is much less, since only two multipliers are required and only one correction parameter is involved, specifically a suitable approximation of $\tan(\Delta\varphi/2)$. Since the tangent is a linear function of small angles, there is also no need for trigonometric tables.

In most general form, the present invention therefore relates to a method for the compensation of the phase asymmetry between the inphase (I) and the quadrature (Q) components in radio signal transmitters or receivers with quadrature modulation or demodulation, in the case of which method the phase error between the uncompensated I and Q components is determined, and a compensated I component is obtained by subtracting from the I component, which is uncompensated, unaltered or multiplied by a constant, the product of the Q component and an error term T dependent on the phase error $\Delta\phi$, and a compensated Q component is obtained by subtracting from the Q component, which is uncompensated, unaltered or multiplied by a constant, the product of the I component and the error term T.

In the remaining method steps, in which the compensated I and Q components are calculated from the determined phase error and the uncompensated I and Q components, the error term T is preferably proportional to $\tan(\Delta\phi/2)$ in accordance with the above compensation matrix (4). A suitable approximation of the tangent must be found when attempting to convert the compensation matrix by circuit engineering. The I or the Q component can be multiplied by 1 or by another constant, in order to obtain the corresponding compensated component, and the error term T can then be multiplied by the same constant in order to feed both variables to the corresponding adder. Since $\tan(\Delta\phi/2)$ can be approximated by $T/2^N$, the error term T is therefore given by $\tan(\Delta\phi/2) \times 2^N$. When the compensation terms are obtained by a multiplication by the error term T in the case of implementation using circuit engineering, the linear terms must simultaneously be multiplied by the constant $2^N$. The result in each of the components is an increase in level by the factor $2^N$, but this can, however, be compensated again by division by $2^N$ downstream of the adder or at the output of the compensator. The number N is a natural number and can be regarded as the resolution of the compensator.

The method according to the invention can be used both in transmitters and in receivers. In transmitters which operate with the quadrature modulation method, it can be used for phase compensation between I and Q paths. It can be used with the same aim in receivers which have an analogue quadrature stage, in particular in directly mixing receivers.

A device for carrying out the method has two inputs for the uncompensated I and Q components and two outputs for the corresponding compensated components. The device can further include a calculation unit for calculating the phase error from the compensated components and for outputting the error term T. In this case, the error term T supplied by the calculation unit is fed to a first multiplier and a second multiplier. The multiplication of the input-end Q component by the error term is carried out in the first multiplier, and the multiplication of the input-end I component by the error term is carried out in the second multiplier. The I component, which is unaltered or multiplied by a constant, and the output of the second multiplier are fed to a first adder for determining the compensated I component, and the Q component, which is unaltered or multiplied by a constant, and the output of the first multiplier are fed to a second adder for determining the compensated Q component.

When the error term T is equal to $\tan(\Delta\phi/2) \times 2^N$, a third multiplier can be provided for the multiplication of the uncompensated I component by the factor $2^N$, and a fourth multiplier can be provided for the multiplication of the uncompensated Q component by the factor $2^N$. In this case, the third and/or the fourth multiplier/multipliers can also be formed by shift registers which are driven in such a way that bit words fed are shifted by N bit positions in the direction of the most significant bit position.

BRIEF DESCRIPTION OF THE DRAWINGS

Exemplary embodiments for the implementation of the method according to the invention are explained in more detail below with the aid of the figures of the drawing, in which.

DETAILED DESCRIPTION OF PREFERRED EMBODIMENTS

Figure 1:
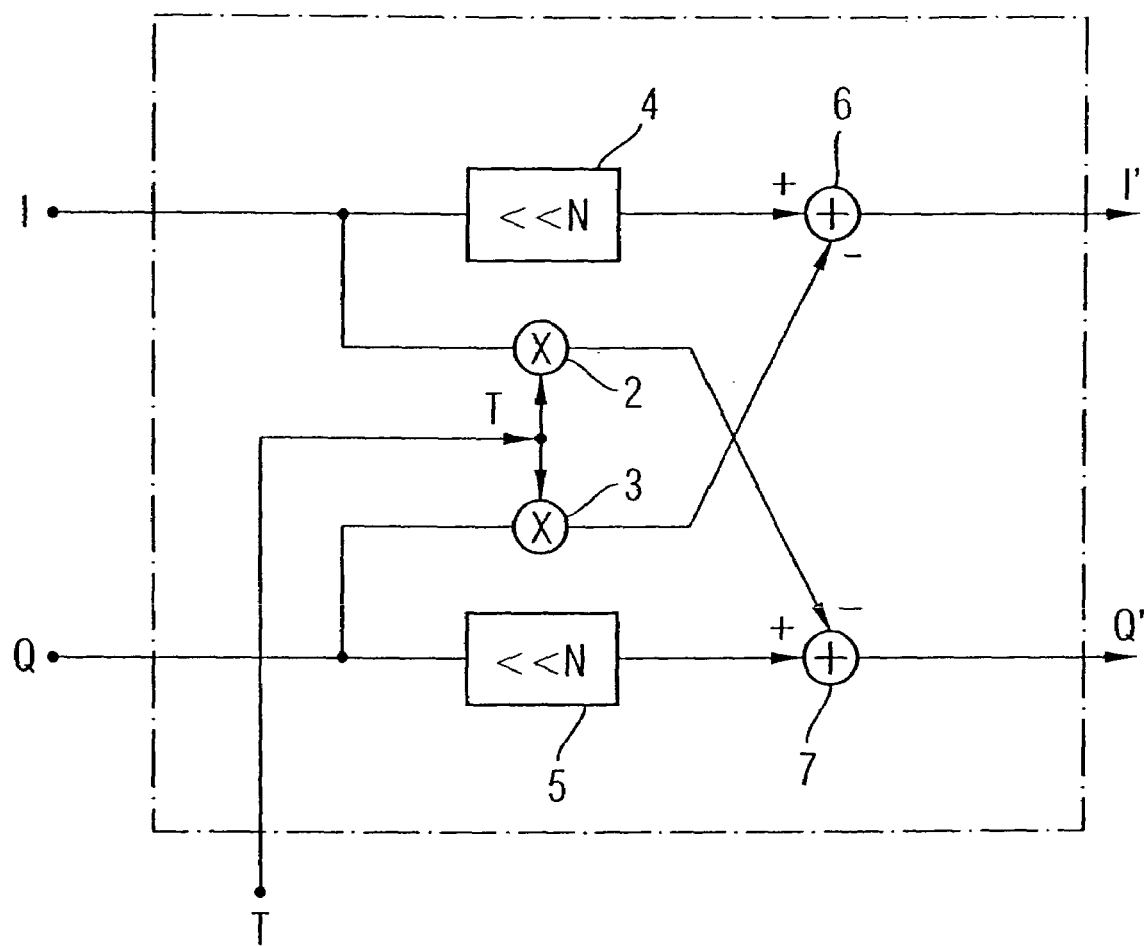
FIG. 1 shows a first exemplary embodiment for a phase compensator for carrying out the method according to the invention.

In FIG. 1, the phase compensator is illustrated in a fashion bordered by dashes and dots, and has two inputs via which the phase-uncompensated components I and Q are fed, and also two outputs to which the phase-compensated components I' and Q' are output.

The phase compensator can be included, for example, in a radio signal receiver with an analogue quadrature stage, in which the I and Q components are respectively fed to analogue/digital converters. It is then firstly possible to use the digitized I and Q values to compensate other IQ asymmetries such as the offset or level asymmetries described at the beginning, and so it may be assumed that the digital values arriving at the inputs of the phase compensator are still uncompensated only with regard to the phase asymmetry.

It may be provided for the purpose of determining the error term T that the digital I and Q signals initially pass through the circuit in an unaltered fashion up to the multiplication by constants, and are fed at the end of the circuit to a calculation unit (not illustrated) in which the phase error Δφ between the components is determined in a way known per se. The error term T is calculated from the phase error Δφ using the formula $\tan(\Delta\phi/2)\times 2^N$ and fed to the digital multipliers 2 and 3. The multipliers 2 and 3 are likewise each fed the data words of the I and Q components. Since the error term T is a product of the tangent and $2^N$, the I and Q components must likewise be multiplied by the factor $2^N$. This is achieved by means of the shift registers 4 and 5 in which it is indicated symbolically that data words inserted into these shift registers are shifted by N bit positions in the direction of the most significant bit position, the result being to implement a multiplication by the factor $2^N$. After these operations have been carried out, the data word is read out of the shift register 4 and fed to a first adder 6. The multiplier 3 carries out a multiplication of the Q component by the error term T, and the result is likewise fed, with its sign reversed, to the first adder 6. At its output, the first adder 6 then outputs an I' component compensated after this first iteration step.

The Q component is multiplied in just such a way in the second shift register 5 by the factor $2^N$ and fed to a second adder 7. A multiplication of the I component by the error term T is carried out in the multiplier 2, and the result of the multiplication is fed, with reversed sign, to the second adder 7. A Q' signal compensated after this first iteration step is output as the result of the addition by the second adder.

After one iteration step of the calculation of the compensated components, one or more further iteration steps can be carried out by redetermining an error term from the compensated components I' and Q', that is to say, for example, by repeating the output of the adders 6 and 7 to the calculation unit in order to detect any possibly still existing phase error, and to carry out renewed compensation with the aid of the already updated I and Q components, and of the phase error determined between these. It is possible either to carry out a specific number of iteration steps, or to carry out iteration steps until the phase error undershoots a specific limit. This can be monitored, for example, by the calculation unit, and an undershooting of this limit which is established by the calculation unit can effect an enabling of the components I' and Q', updated in the last iteration step, at the outputs of the phase compensator.

As has likewise already been established, owing to the multiplication by the factor $2^N$ in all paths of the phase compensator, the output level of the components I' and Q' of the phase compensator is too large by the factor of $2^N$. Moreover, it has already been established in conjunction with the calculation of the compensation matrix (4) that a change in level expressed by the term (5) likewise occurs as a result of the application of the compensation matrix (4). It may be provided after the components I' and Q' are output that the level of these components is adapted by dividing by the factor $2^N$ and the term (5).

Figure 2:
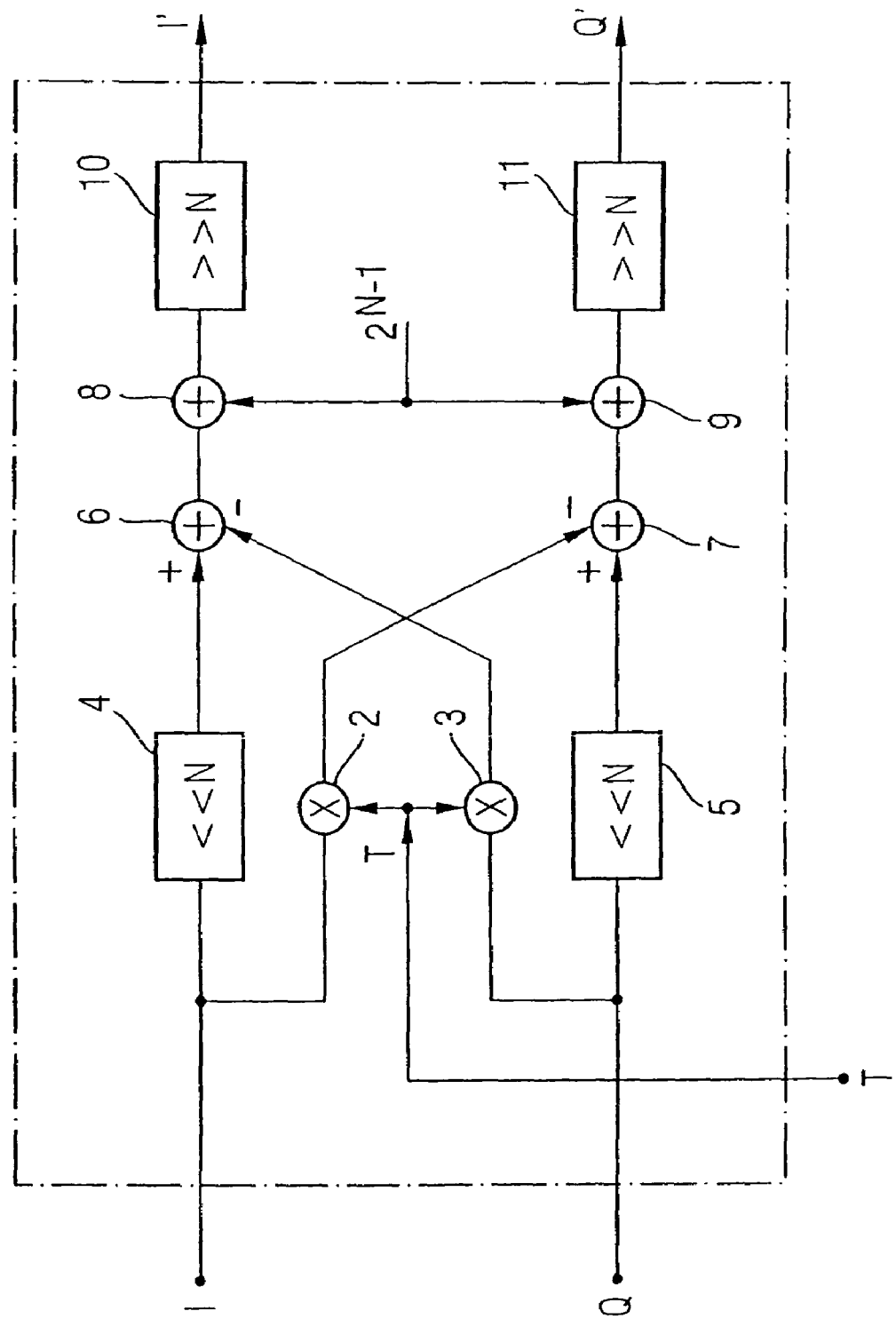
FIG. 2 shows a second exemplary embodiment for a phase compensator for carrying out the method according to the invention.

An embodiment of a phase compensator for carrying out the method according to the invention which has been modified by comparison with FIG. 1 is illustrated in FIG. 2, functionally identical components having been provided with the same reference symbols. Substantial changes were made by further using a third shift register 10 and a fourth shift register 11, which registers are used to divide the data words by the factor $2^N$ in each case, in I and Q paths upstream of the outputs of the phase compensator. This ensures that the level states of the signals can already be adapted up to the above term (5) inside the phase compensator. Before the data words in the I and Q paths are fed to the shift registers 10 and 11, the binary number $2^{N-1}$ is appended additively to them in adders 8 and 9 respectively. The intention of this operation is to divide the output signal of the adders 6 and 7 by $2^N$ and round it off to an integral value. This is equivalent to calculating the rounded-off number of $(I'/2^N+0.5)$, which is equivalent, in turn, to calculating the rounded-off number of $((I'+2^{N-1}))/2^N$.

In the embodiment of FIG. 2, the output signals I' and Q' of the phase compensator can be further processed in an essentially unaltered fashion, since the levels of the components have already been adapted in the phase compensator by the shift registers 10 and 11.

We claim:
1. A method for the compensation of the phase asymmetry between the inphase (I) and the quadrature (Q) components in the case of quadrature modulation or demodulation, comprising the steps of:
   determining the phase error Δφ between the uncompensated I and Q components,
   obtaining a compensated I component by subtracting from the I component, which is uncompensated, unaltered or multiplied by a constant, the product of the Q component and an error term which is proportional to $\tan(\Delta\phi/2)$, and
   obtaining a compensated Q component by subtracting from the Q component, which is uncompensated, unaltered or multiplied by a constant, the product of the I component and the error term.
2. The method according to claim 1, wherein
   the error term is equal to $\tan(\Delta\phi/2)\times 2^N$, wherein N being a natural number, and
   the uncompensated I component is multiplied by $2^N$ when calculating the compensated I component, and
   the uncompensated Q component is multiplied by $2^N$ when calculating the compensated Q component.
3. The method according to claim 1, wherein
   to calculate a vector of the compensated components, a vector of the uncompensated components is multiplied by the compensation matrix

$$\begin{bmatrix} 1 & -\tan\left(\frac{\Delta\varphi}{2}\right) \\ -\tan\left(\frac{\Delta\varphi}{2}\right) & 1 \end{bmatrix}.$$

4. The method according to claim 1, wherein
   a plurality of iterations of the method are passed through,
   the number of the iterations being prescribed, or
   iterations are passed through until the phase error undershoots a prescribed limit.
5. The method according to claim 1, wherein
   the method is used in a radio signal receiver with an analogue quadrature stage, in particular a directly mixing radio signal receiver.
6. The method according to claim 1, wherein
   the method is used in a radio signal receiver in which a quadrature modulation method is employed.
7. A device for the compensation of the phase asymmetry between the inphase (I) and the quadrature (Q) components in the case of quadrature modulation or demodulation, comprising:
   two inputs for uncompensated I and Q components and two outputs for compensated I and Q components, a calculation unit for calculating an phase error $\Delta\phi$ from the compensated or the uncompensated I and Q components and outputting an error term, a first multiplier, connected to the calculation unit, for the multiplication of the uncompensated Q component by the error term, generating a first multiplication value, a second multiplier, connected to the calculation unit, for the multiplication of the uncompensated I component by the error term, generating a second multiplication value, a first adder, which can be fed the uncompensated I component, which is unaltered or multiplied by a constant, and which adder is fed with the first multiplication value, and a second adder, which can be fed the uncompensated Q component, which is unaltered or multiplied by a constant, and which adder is fed with the second multiplication value wherein the error term is equal to $\tan(\Delta\phi/2)\times 2^N$, and the device further comprises:

a third multiplier for a multiplication of the I component by the factor $2^N$ before feeding to the first adder, and a fourth multiplier for a multiplication of the Q component by the factor $2^N$ before feeding to the second adder.

8. The device according to claim 7, wherein
the third and/or the fourth multiplier are formed by shift registers which are driven in such a way that bit words fed are shifted by N bit positions in the direction of the most significant bit position.

9. The device according to claim 7, further comprising:
a third adder following the first adder for adding a constant and a first divider following the third adder for dividing an output of the third adder by a factor $2^N$, and
a fourth adder following the second adder for adding a constant and a second divider following the fourth adder for dividing an output of the fourth adder by a factor $2^N$.

10. The device according to claim 9, wherein
the first and/or the second divider are formed by shift registers which are driven in such a way that bit words fed are shifted by N bit positions in the direction of the least significant bit position.

11. A method for the compensation of the phase asymmetry between the inphase (I) and the quadrature (Q) components in the case of quadrature modulation or demodulation, comprising the steps of:

determining the phase error $\Delta\phi$ between the uncompensated I and Q components, obtaining a compensated I component by subtracting from the I component, which is uncompensated, unaltered or multiplied by a constant, the product of the Q component and an error term dependent on the phase error $\Delta\phi$, and obtaining a compensated Q component by subtracting from the Q component, which is uncompensated, unaltered or multiplied by a constant, the product of the I component and the error term, wherein to calculate a vector of the compensated components, a vector of the uncompensated components is multiplied by the compensation matrix $$\begin{bmatrix} 1 & -\tan\left(\frac{\Delta\varphi}{2}\right) \\ -\tan\left(\frac{\Delta\varphi}{2}\right) & 1 \end{bmatrix}.$$

12. The method according to claim 11, wherein
a plurality of iterations of the method are passed through, the number of the iterations being prescribed, or iterations are passed through until the phase error undershoots a prescribed limit.

13. The method according to claim 11, wherein
the method is used in a radio signal receiver with an analogue quadrature stage, in particular a directly mixing radio signal receiver.

14. The method according to claim 11, wherein
the method is used in a radio signal receiver in which a quadrature modulation method is employed.

15. A method for the compensation of the phase asymmetry between the inphase (I) and the quadrature (Q) components in the case of quadrature modulation or demodulation, comprising the steps of:

determining the phase error $\Delta\phi$ between the uncompensated I and Q components, obtaining a compensated I component by subtracting from the I component, which is uncompensated, unaltered or multiplied by a constant, the product of the Q component and an error term dependent on the phase error $\Delta\phi$, and obtaining a compensated Q component by subtracting from the Q component, which is uncompensated, unaltered or multiplied by a constant, the product of the I component and the error term, wherein a plurality of iterations of the method are passed through, wherein the number of the iterations is prescribed, or iterations are passed through until the phase error undershoots a prescribed limit.

16. The method according to claim 15, wherein
the error term is proportional to $\tan(\Delta\phi/2)$.

17. The method according to claim 16, wherein
the error term is equal to $\tan(\Delta\phi/2)\times 2^N$, wherein N being a natural number, and
the uncompensated I component is multiplied by $2^N$ when calculating the compensated I component, and
the uncompensated Q component is multiplied by $2^N$ when calculating the compensated Q component.

18. A method for the compensation of the phase asymmetry between the inphase (I) and the quadrature (Q) components in the case of quadrature modulation or demodulation, comprising the steps of:

determining the phase error $\Delta\phi$ between the uncompensated I and Q components, obtaining a compensated I component by subtracting from the I component, which is uncompensated, unaltered or multiplied by a constant, the product of the Q component and an error term dependent on the phase error $\Delta\phi$, and obtaining a compensated Q component by subtracting from the Q component, which is uncompensated, unaltered or multiplied by a constant, the product of the I component and the error term, wherein the method is used in a radio signal receiver with an analogue quadrature stage, in particular a directly mixing radio signal receiver or in a radio signal receiver in which a quadrature modulation method is employed.

19. The method according to claim 18, wherein
the error term is proportional to $\tan(\Delta\phi/2)$.

20. The method according to claim 19, wherein
the error term is equal to $\tan(\Delta\phi/2)\times 2^N$, wherein N being a natural number, and
the uncompensated I component is multiplied by $2^N$ when calculating the compensated I component, and
the uncompensated Q component is multiplied by $2^N$ when calculating the compensated Q component.

* * * * *